(12) United States Patent
Kikuchi et al.

(10) Patent No.: US 10,865,948 B2
(45) Date of Patent: Dec. 15, 2020

(54) TRANSPARENT SEALING MEMBER

(71) Applicant: NGK Insulators, Ltd., Nagoya (JP)

(72) Inventors: Yoshio Kikuchi, Nagoya (JP);
Hiroyuki Shibata, Okazaki (JP);
Tatsuya Hishiki, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 16/738,325

(22) Filed: Jan. 9, 2020

(65) Prior Publication Data

US 2020/0149691 A1  May 14, 2020

Related U.S. Application Data

(63) Continuation of application No. PCT/JP2018/011898, filed on Mar. 23, 2018.

(30) Foreign Application Priority Data

Jul. 11, 2017 (WO) .................. PCT/JP2017/025305

(51) Int. Cl.
*F21K 9/66* (2016.01)
*F21K 9/235* (2016.01)
*C03C 3/06* (2006.01)

(52) U.S. Cl.
CPC .................. *F21K 9/66* (2016.08); *C03C 3/06* (2013.01); *F21K 9/235* (2016.08)

(58) Field of Classification Search
CPC . F21K 9/66; F21K 9/235; F21V 3/061; C03C 3/06; H01L 33/48; H01L 33/54; H01L 33/56
See application file for complete search history.

(56) References Cited

U.S. PATENT DOCUMENTS

| | | | |
|---|---|---|---|
| 7,144,146 B2* | 12/2006 | Takeuchi | H01L 51/5262 362/617 |
| 9,391,247 B2* | 7/2016 | Yao | H01L 33/54 |
| 10,407,334 B2* | 9/2019 | Fujino | C03B 19/12 |
| 2010/0237254 A1 | 9/2010 | Mason et al. | |

FOREIGN PATENT DOCUMENTS

| | | |
|---|---|---|
| JP | 2009-532200 A1 | 9/2009 |
| JP | 5243806 B2 | 7/2013 |
| JP | 2014-236202 A1 | 12/2014 |
| JP | 2016-049518 A1 | 4/2016 |
| JP | 2016-050291 A1 | 4/2016 |
| JP | 6068411 B2 | 1/2017 |

OTHER PUBLICATIONS

English translation of International Preliminary Report on Patentability (Chapter I) (Application No. PCT/JP2018/011898) dated Jan. 23, 2020.
International Search Report and Written Opinion (Application No. PCT/JP2018/011898) dated May 15, 2018.

* cited by examiner

*Primary Examiner* — Peggy A Neils
(74) *Attorney, Agent, or Firm* — Burr & Brown, PLLC

(57) ABSTRACT

A transparent sealing member is provided with minute recesses at least in the surface of the member from which light from an optical element is emitted. The average width of the minute recesses is 0.1 μm to 2.0 μm, the average depth of the minute recesses is 5 nm to 50 nm, and the average frequency of occurrence of the minute recesses is 100000 to 3000000 recesses per 1 $mm^2$.

4 Claims, 9 Drawing Sheets

FIG. 7

[Table 1]

| | Manufacturing Method | Firing Temperature (°C) | Size of Minute Recesses | | | | | | Number of Minute Recesses | | | Surface Roughness Ra (μm) |
|---|---|---|---|---|---|---|---|---|---|---|---|---|
| | | | Minimum Width (μm) | Maximum Width (μm) | Average Width (μm) | Minimum Depth (nm) | Maximum Depth (nm) | Average Depth (nm) | Minimum Number (10000/mm²) | Maximum Number (10000/mm²) | Average Number (10000/mm²) | |
| Exemplary Embodiment 1 (Sample 1) | Powder Sintering | 1600–1700 | 0.2 | 0.8 | 0.6 | 4 | 36 | 10 | 20 | 36 | 29 | 0.017 |
| Exemplary Embodiment 2 (Sample 2) | Powder Sintering | 10°C Lower Than Exemplary Embodiment 1 | 0.3 | 2.2 | 0.8 | 2 | 36 | 14 | 36 | 164 | 76 | 0.028 |
| Exemplary Embodiment 3 (Sample 3) | Powder Sintering | 20°C Lower Than Exemplary Embodiment 1 | 0.6 | 1.7 | 1.0 | 4 | 34 | 15 | 152 | 220 | 188 | 0.013 |
| Comparative Example 1 (Sample 4) | Powder Sintering | 190°C Lower Than Exemplary Embodiment 1 | 2.3 | 11.6 | 6.3 | 100 | 525 | 234 | 2 | 2 | 2 | 0.165 |
| Comparative Example 2 (Sample 5) | Polishing Process | – | 0.6 | 3.3 | 1.6 | 0.3 | 1.4 | 0.7 | – | – | – | 0.002 |

FIG. 8

[Table 2]

| | Manufacturing Method | Firing Temperature (°C) | Linear Transmittance Initial Value LTa (%) | Maintenance Rate of Initial Linear Transmittance Rrb After Immersion Test (%) | Maintenance Rate of Initial Linear Transmittance Rrc After Cleaning (%) |
|---|---|---|---|---|---|
| Exemplary Embodiment 1 (Sample 1) | Powder Sintering | 1600-1700 | 88 | 73 | 90 |
| Exemplary Embodiment 2 (Sample 2) | Powder Sintering | 10°C Lower Than Exemplary Embodiment 1 | 88 | 72 | 92 |
| Exemplary Embodiment 3 (Sample 3) | Powder Sintering | 20°C Lower Than Exemplary Embodiment 1 | 84 | 73 | 95 |
| Comparative Example 1 (Sample 4) | Powder Sintering | 190°C Lower Than Exemplary Embodiment 1 | 11 | 40 | 40 |
| Comparative Example 2 (Sample 5) | Polishing Process | – | 91 | 22 | 35 |

TRANSPARENT SEALING MEMBER

CROSS-REFERENCE TO RELATED APPLICATIONS

This application is a Continuation of International Application No. PCT/JP2018/011898 filed on Mar. 23, 2018, which is based upon and claims the benefit of priority from International Application No. PCT/JP2017/025305 filed on Jul. 11, 2017, the contents all of which are incorporated herein by reference.

TECHNICAL FIELD

The present invention relates to a transparent sealing member which is used with an optical component, for example, such as an LED (light emitting diode), an LD (semiconductor laser), or the like.

BACKGROUND ART

Recently, methods of using a light emitting element (ultraviolet LED) that emits ultraviolet rays for the purposes of sterilization and purification are becoming widespread. In such an ultraviolet LED device, a transparent sealing member is required in order to protect the light emitting element from the outside air and moisture. From the standpoints of permeability to ultraviolet rays and durability, glass or quartz glass is used as the transparent sealing member.

In Japanese Patent No. 6068411 and Japanese Laid-Open Patent Publication No. 2009-532200 (PCT), a water purification device using an ultraviolet LED is disclosed. In Japanese Patent No. 5243806, a transparent sealing member is disclosed in which a translucent plate material and a hemispherical lens are formed together in an integrated manner.

SUMMARY OF INVENTION

In general, in applications for purifying liquids such as polluted water and the like, there are cases in which contaminants such as microorganisms, humic substances, and proteins may adhere to the surface of the transparent sealing member. In such cases, a problem of fouling is known in which, for example, the amount of ultraviolet light emitted from the optical element decreases at the surface of the transparent sealing member, and the sterilizing effect due to ultraviolet light decreases.

The present invention has been devised taking into consideration the aforementioned problem, and has the object of providing a transparent sealing member in which, by way of minute recesses provided on the surface, an effect can be made to occur in which contaminants are less likely to adhere and are easily peeled off, and it is possible to suppress a decrease in the sterilizing effect due to fouling.

[1] A transparent sealing member according to the present invention is adapted to be used with an optical component having at least one optical element, and a mounting substrate on which the optical element is mounted, and constituting, together with the mounting substrate, a package in which the optical element is accommodated, wherein the transparent sealing member includes minute recesses on a least a surface from which light from the optical element is emitted, an average width of the respective minute recesses is greater than or equal to 0.1 µm and less than or equal to 2.0 µm, and an average depth of the respective minute recesses is greater than or equal to 5 nm and less than or equal to 50 nm, and an average existence frequency of the minute recesses is greater than or equal to 100,000 and less than or equal to 3 million per 1 mm².

In general, in applications for purifying liquids such as polluted water and the like, there are cases in which contaminants such as microorganisms, humic substances, and proteins may adhere to the surface of the transparent sealing member. In such cases, the problem of fouling is known in which, for example, the amount of ultraviolet light emitted from the optical element decreases at the surface of the transparent sealing member, and the sterilizing effect due to ultraviolet light decreases.

Since the present invention includes the minute recesses at least on the surface from which light from the optical element is emitted, on the minute recesses of the surface, water currents exist along the minute recesses, and further, due to the configuration of the minute recesses, the contact area with the foulant is reduced. Consequently, it becomes difficult for the foulant to remain on the surface of the transparent sealing member. More specifically, it is possible to suppress a reduction in the amount of light due to the aforementioned fouling.

[2] In the present invention, the material of the transparent sealing member is preferably quartz glass.

[3] In the present invention, a surface roughness Ra of at least the surface from which light from the optical element is emitted is preferably 0.01 to 0.05 µm.

As described above, in accordance with the transparent sealing member according to the present invention, by way of the minute recesses provided on the surface, an effect can be made to occur in which contaminants are less likely to adhere and are easily peeled off, and it is possible to suppress a decrease in the sterilizing effect due to fouling.

BRIEF DESCRIPTION OF DRAWINGS

FIG. 7 is a Table 1 showing a method of manufacturing, a firing temperature, a size of the minute recesses, a number of the minute recesses, and a surface roughness, in Exemplary Embodiments 1, 2, and 3, and Comparative Examples 1 and 2;

FIG. 8 is a Table 2 showing a method of manufacturing, a firing temperature, an initial linear transmittance, and a maintenance rate of the initial linear transmittance in Exemplary Embodiments 1, 2, and 3, and Comparative Examples 1 and 2;

DESCRIPTION OF EMBODIMENTS

Embodiments of a transparent sealing member according to the present invention will be presented and described below with reference to FIGS. 1A to 9C.

Figure 1A:
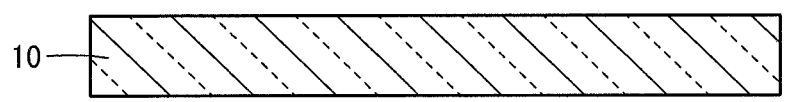
FIG. 1A is a vertical cross-sectional view showing a transparent sealing member according to a present embodiment.

As shown in FIG. 1A, the transparent sealing member 10 according to the present embodiment is formed, for example, in a flat plate-like shape. An outer shape of the transparent sealing member 10, for example, is of a cylindrical shape, a quadrangular shape, a polygonal tubular shape, or the like. The transparent sealing member 10 is constituted, for example, from quartz glass.

Figure 1B:
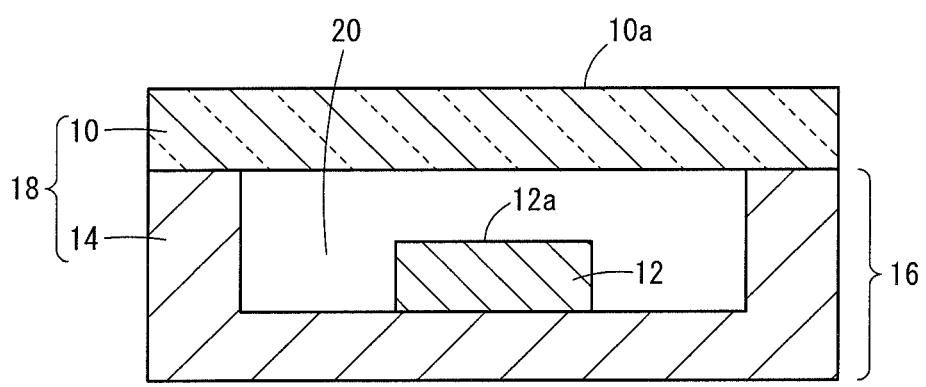
FIG. 1B is a vertical cross-sectional view showing an example of an optical component constituted by a transparent sealing member being sealed thereon.

As shown in FIG. 1B, the transparent sealing member 10 is used with an optical component 16 having at least one optical element 12 that emits, for example, ultraviolet light, and a mounting substrate 14 on which the optical element 12 is mounted, and constitutes a package 18 in which the optical element 12 is accommodated together with the mounting substrate 14.

The mounting substrate 14 includes a concave portion 20 having an upper surface opening, and the optical element 12 is mounted on a bottom part of the concave portion 20. The transparent sealing member 10 is sealed on the mounting substrate 14, in a manner so as to close the upper surface opening of the concave portion 20 of the mounting substrate 14. The mounting substrate 14 is constituted, for example, from AlN (aluminum nitride).

Although not illustrated, the optical element 12 is configured, for example, by laminating a GaN-based crystalline layer having a quantum well structure on a sapphire substrate (coefficient of thermal expansion: $7.7 \times 10^{-6}/°$ C.). As a method of mounting the optical element 12, for example, a so-called face-up mounting method can be adopted in which the light emitting surface 12a is mounted in facing relation to the transparent sealing member 10. More specifically, terminals (not shown) that are led out from the optical element 12, and circuit wirings (not shown) that are formed on the mounting substrate 14, for example, are electrically connected by bonding wires (not shown). Of course, a so-called flip chip mounting, in which the light emitting surface 12a is mounted in facing relation to the mounting substrate 14, can also be favorably employed.

Figure 2:
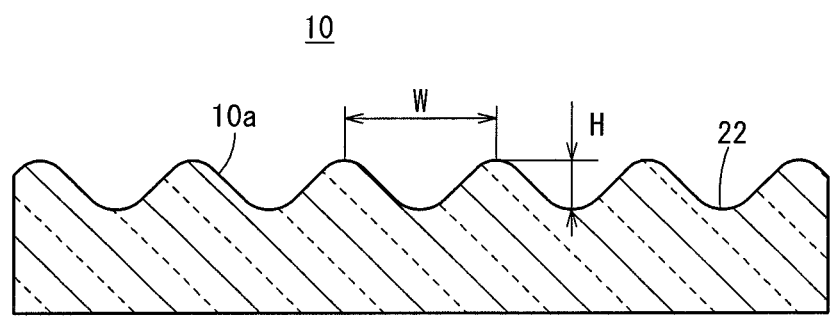
FIG. 2 is an explanatory diagram schematically showing minute recesses formed on a surface of the transparent sealing member.

In addition, as shown in FIG. 2, the transparent sealing member 10 has a large number of minute recesses (hereinafter referred to as minute recesses 22), on at least the surface from which the ultraviolet light from the optical element 12 (see FIG. 1B) is emitted. The average width W of the respective minute recesses 22 is greater than or equal to 0.1 μm and less than or equal to 2.0 μm, and the average depth H of the respective minute recesses 22 is greater than or equal to 5 nm and less than or equal to 50 nm. Further, the average existence frequency of the minute recesses 22 is greater than or equal to 100,000 and less than or equal to 3 million per 1 mm$^2$. The surface roughness Ra of the surface 10a (see FIG. 1B) from which the ultraviolet light is emitted is 0.01 to 0.05 μm.

The average width W of the minute recesses 22 can be determined by measuring widths indicated, for example, by the following items (A) and (B), for a plurality of the minute recesses 22 taken as measurement targets, and then dividing the sum total of the measured widths by the number of the minute recesses 22 that were measured. Moreover, the minimum width of the minute recesses 22 indicates the smallest width from among the measured widths of the plurality of minute recesses 22, and the maximum width of the minute recesses 22 indicates the largest width from among the measured widths of the plurality of minute recesses 22.

Figure 3A:
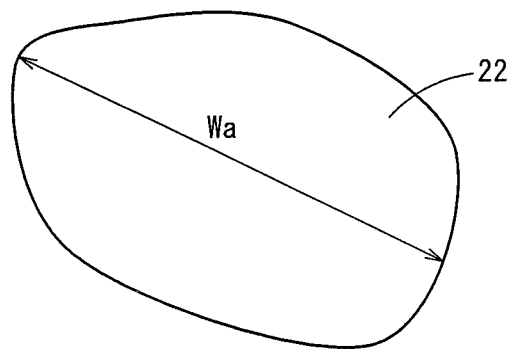
FIG. 3A is an explanatory diagram showing an example of a maximum width of an opening portion of a minute recess.

(A) The maximum width Wa at the opening portion of the respective minute recesses 22 (see FIG. 3A).

Figure 3B:
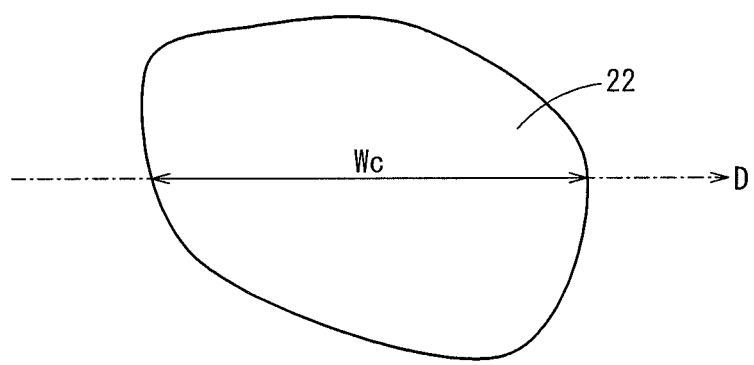
FIG. 3B is an explanatory diagram showing an example of a width in a specified direction that is set beforehand in the opening portion of the minute recess.

(B) A width We in a predetermined specific direction D at the opening portion of the respective minute recesses 22 (see FIG. 3B).

The average depth H of the minute recesses 22 can be determined by measuring depths indicated, for example, by the following items (a) and (b), for a plurality of the minute recesses 22 taken as measurement targets, and then dividing the sum total of the measured depths by the number of the minute recesses 22 that were measured. Moreover, the minimum depth of the minute recesses 22 indicates the smallest depth from among the measured depths of the plurality of minute recesses 22, and the maximum depth of the minute recesses 22 indicates the largest depth from among the measured depths of the plurality of minute recesses 22.

Figure 4A:
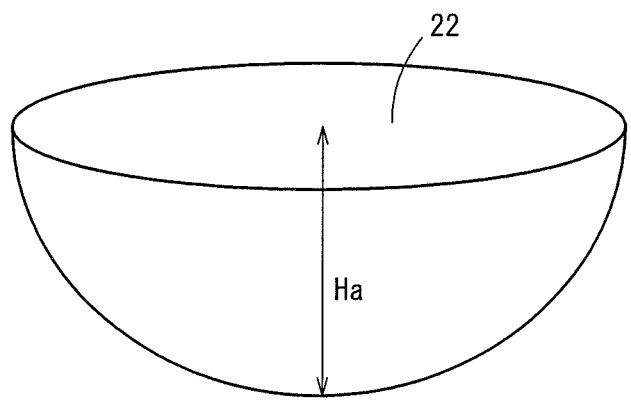
FIG. 4A is an explanatory diagram showing an example of a maximum depth of the minute recess.

(a) The maximum depth Ha of the respective minute recesses 22 (see FIG. 4A).

Figure 4B:
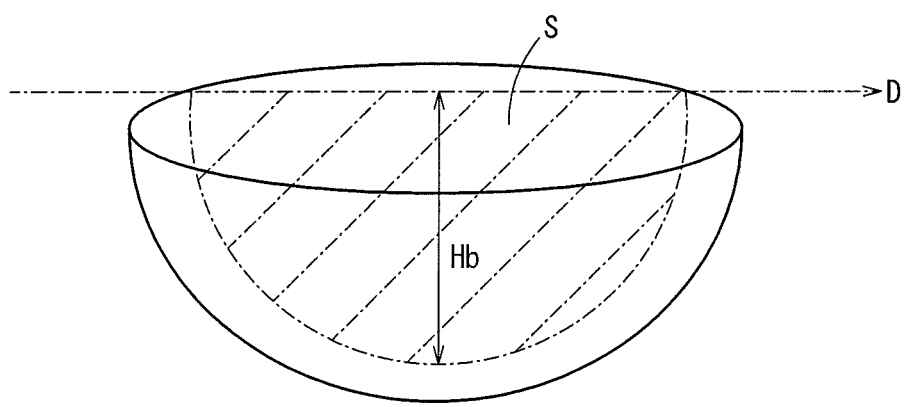
FIG. 4B is an explanatory diagram showing an example of a maximum depth of a plane that is obtained by cutting the minute recess along a predetermined specified direction.

(b) The maximum depth Hb of a surface S obtained by cutting the respective minute recesses along the predetermined specified direction D (see FIG. 4B).

As a method of manufacturing the first transparent sealing member 10 having such a shape, preferably, a powder sintering method can be employed. For example, a molding slurry containing silica powder and organic compounds is cast into a molding die and solidified by a chemical reaction of the organic compounds, for example, a chemical reaction between a dispersion medium and a curing agent, or between curing agents, and thereafter, the solidified product is released from the mold. Then, the transparent sealing member 10 can be produced by firing.

Concerning the dimensions of the transparent sealing member 10, a height thereof is 0.1 to 10 mm, and an outer diameter thereof is 3.0 to 10 mm. Moreover, concerning the dimensions of the optical element 12, a thickness thereof is 0.005 to 0.5 mm, and although not shown, a vertical dimension as viewed from the upper surface is 0.5 to 2.0 mm, and a horizontal dimension is 0.5 to 2.0 mm.

EXEMPLARY EMBODIMENTS

Next, the influence due to fouling was confirmed in relation to Exemplary Embodiments 1 to 3 and Comparative Examples 1 and 2.

Exemplary Embodiment 1 (Sample 1)

The transparent sealing member according to Exemplary Embodiment 1 (Sample 1) has a configuration similar to that of the transparent sealing member 10 shown in FIG. 1A.

(Manufacturing of the Transparent Sealing Member)

The method of manufacturing the transparent sealing member according to Sample 1 is as described below. More specifically, a slurry was prepared by mixing 100 parts by mass of a silica powder having an average particle diameter of 0.5 μm as a raw material powder, 2 parts by mass of a carboxylic acid copolymer as a dispersing agent, 49 parts by mass of dimethyl malonate as a dispersing medium, 4 parts by mass of ethylene glycol, 4 parts by mass of 4'4-diphenylmethane diisocyanate as a curing agent, and 0.4 parts by mass of triethylamine as a catalyst.

The slurry was poured into a metal mold at room temperature, and left at room temperature for a fixed time period. Subsequently, the molded body was released from the mold. Furthermore, the molded body was allowed to stand at room temperature, and then at a temperature of 90° C. for a certain period of time in order to obtain a silica powder dried body. Moreover, the average particle size of the raw material powder was measured using a laser diffraction/dispersion particle size distribution measurement apparatus LA-750 manufactured by Horiba.

The thus manufactured silica powder dried body was calcined at 500° C. in air, and then fired at 1600 to 1700° C. in a hydrogen atmosphere, to thereby become denser and be made transparent in order to produce the transparent sealing member. The transparent sealing member 10 has an outer shape of 3.5 mm$^2$ and a height of 0.5 mm.

Exemplary Embodiment 2 (Sample 2)

The transparent sealing member according to Exemplary Embodiment 2 (Sample 2) was manufactured in the same manner as in Sample 1, except that the manufactured silica powder dried body was calcined at 500° C. in the atmosphere, and thereafter was fired in a hydrogen atmosphere at a temperature that was 10° C. lower than that of Sample 1.

Exemplary Embodiment 3 (Sample 3)

The transparent sealing member according to Exemplary Embodiment 3 (Sample 3) was manufactured in the same manner as in Sample 1, except that the manufactured silica powder dried body was calcined at 500° C. in the atmosphere, and thereafter was fired in a hydrogen atmosphere at a temperature that was 20° C. lower than that of Sample 1.

Comparative Example 1 (Sample 4)

The transparent sealing member according to Comparative Example 1 (Sample 4) was manufactured in the same manner as in Sample 1, except that the manufactured silica powder dried body was calcined at 500° C. in the atmosphere, and thereafter was fired in a hydrogen atmosphere at a temperature that was 190° C. lower than that of Sample 1.

Comparative Example 2 (Sample 5)

The transparent sealing member according to Comparative Example 2 (Sample 5) was manufactured by carrying out a polishing process on fused silica glass.

<Method of Evaluation>
(Configuration of Recesses)

For each one of the samples, five AFM surface images were obtained using AFM (atomic force microscopy). Three line profiles were acquired from each of the AFM surface images, and arbitrary twenty recesses were extracted from the line profiles. More specifically, for each one of the samples, (20 individual instances/1 AFM surface image)×5 AFM surface images=100 minute recesses 22 were extracted. Then, for each one of the samples, the minimum width, the maximum width, and the average width, along with the minimum depth, the maximum depth, and the average depth of 100 minute recesses 22 were acquired.

Figure 5:
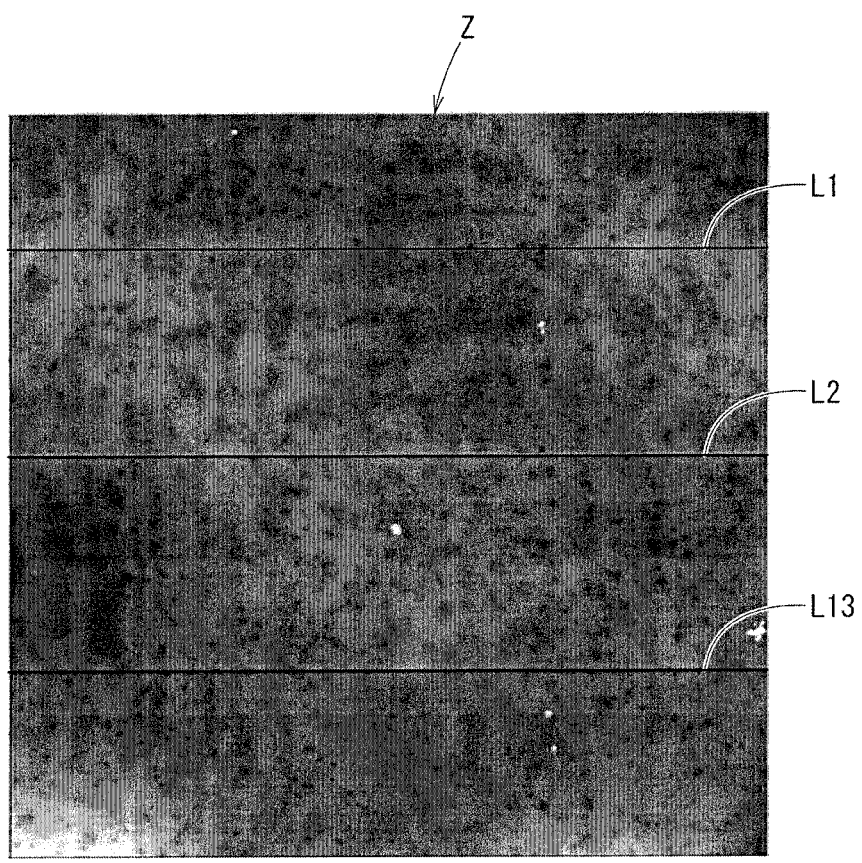
FIG. 5 is an explanatory diagram showing examples of three lines for acquiring three line profiles with respect to one inspection target region of a Sample 1.
Figure 6A:
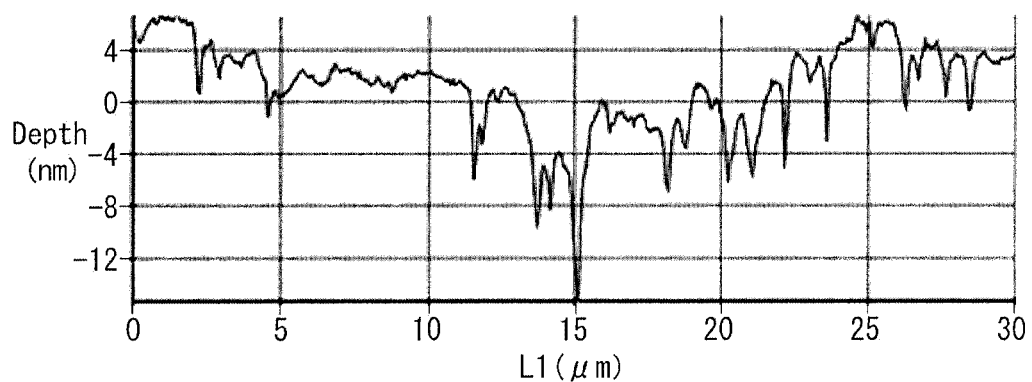
FIGS. 6A, 6B, and 6C are graphs showing examples of three line profiles acquired from lines L1 to L3 of the one inspection target region of the Sample 1.
Figure 6B:
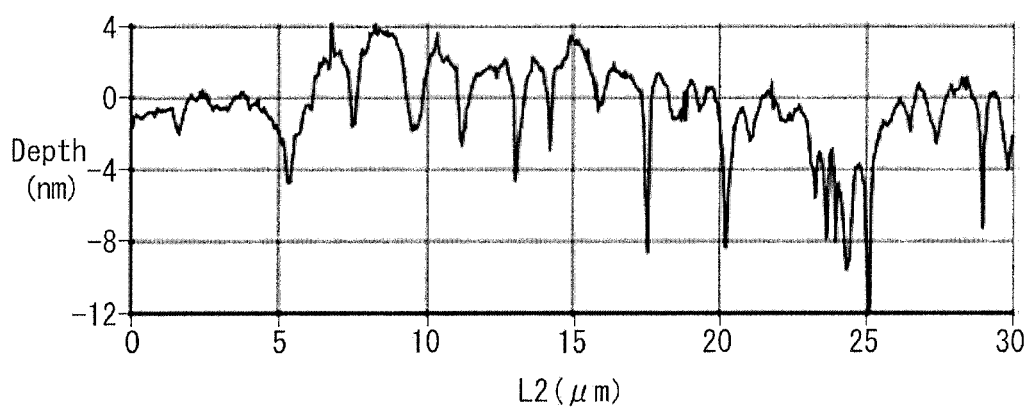
Figure 6C:
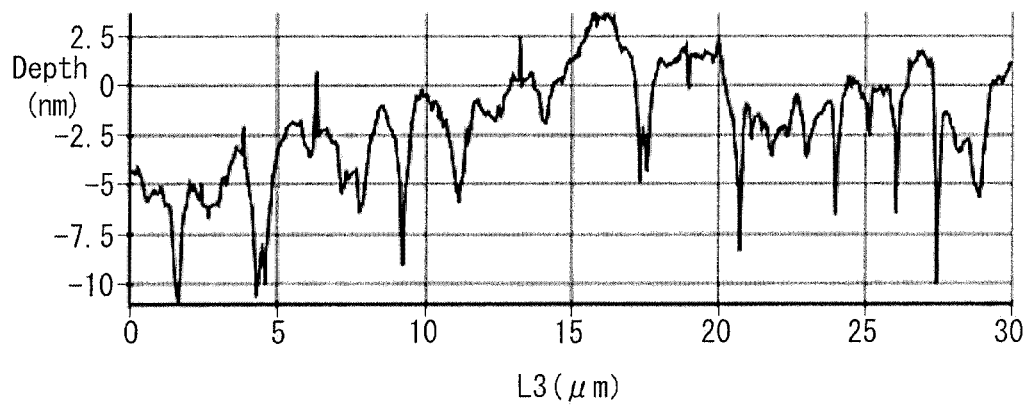

In FIG. 5, examples are shown of three lines L1, L2, and L3, for the purpose of acquiring three line profiles with respect to one inspection target region Z of one instance of the Sample 1. In FIGS. 6A-6C, the acquired three line profiles are shown.

(Frequency at which Minute Recesses 22 Occur)

For each one of the samples, five AFM surface images were obtained. Concerning each of the AFM surface images, the number of minute recesses 22 in four arbitrarily set inspection target regions Z were counted, and the respective count values were converted into a number of individual recesses per 1 mm$^2$. Then, for each of the samples, the maximum number, the minimum number, and the average number of the minute recesses 22 were acquired. Moreover, the size of the inspection target regions Z was from 5 to 50 μm$^2$, and a region in which at least five of the minute recesses 22 existed was selected.

(Surface Roughness)

The surface roughness Ra was measured using the AFM surface images.

(Linear Transmittance and Immersion Test)

Concerning each of the samples, the linear transmittance before executing an immersion test was defined as an initial linear transmittance LTa. The samples were irradiated with ultraviolet light having a wavelength of 300 nm, and the initial linear transmittances LTa of the samples were measured. The linear transmittances were measured using a spectrophotometer manufactured by JASCO Corporation.

Thereafter, the samples were immersed and held in a system through which raw water obtained from a water purification plant is circulated. After one month, the samples were taken out from the system, and the linear transmittances of the samples were measured in the same manner as described previously. The measured values were regarded as a linear transmittance LTb after the immersion test.

Thereafter, the samples after having being subjected to the immersion test were inserted into a beaker containing ion exchange water, and after cleaning of the samples was carried out by irradiating the samples with 10 W ultrasonic waves for one minute, the linear transmittances of the samples were measured in the same manner as described previously. The measured values were regarded as a linear transmittance LTc after cleaning.

(Initial Linear Transmittance Maintenance Rates)

For each of the respective samples, the following calculations were performed, and two initial linear transmittance maintenance rates, and more specifically, an initial linear transmittance maintenance rate Rrb after the immersion test, and an initial linear transmittance maintenance rate Rrc after cleaning were determined.

$$Rrb = (LTb/LTa) \times 100 (\%)$$

$$Rrc = (LTc/LTa) \times 100 (\%)$$

(Evaluation Results)

Table 1 of FIG. 7 shows the maximum width and the minimum width of the minute recesses 22, the maximum value and the minimum value of the number of the minute recesses 22, and the surface roughness Ra, in Exemplary Embodiments 1, 2, and 3, and Comparative Examples 1 and 2.

Moreover, in Table 1 of FIG. 7, in Comparative Example 2, since the surface as a whole was a flat surface (the surface roughness Ra thereof was 0.002), the number of minute recesses 22 is indicated as "-".

In Table 2 of FIG. 8, there are shown the maintenance rates Rrb of the initial linear transmittance after the immersion test, and the maintenance rates Rrc of the initial linear transmittance after cleaning, in Examples 1, 2, and 3, and Comparative Examples 1 and 2.

(Considerations)

Figure 9A:
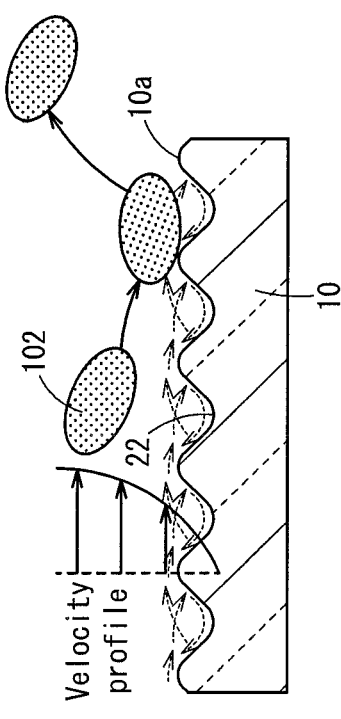
FIG. 9A is an explanatory view schematically showing actions of a transparent sealing member applied with respect to a foulant according to a Comparative Example 2.

First, in Comparative Example 2, the initial linear transmittance LTa was greater than or equal to 90% and less than 95%. However, the maintenance rate Rrb after the immersion test was 22%, and the maintenance rate Rrc after cleaning was 35%, which was extremely low. In this instance, as shown in FIG. 9A, since the surface 100a of the transparent sealing member 100 of Comparative Example 2 is flat, the flow of raw water at the interface is a laminar flow. Therefore, it is considered that, since a foulant 102, such as a microorganism, a humic substance or the like, easily arrives at and remains on the surface 100a, and further adheres easily thereto, the decrease in transmittance after the immersion test was large. Further, in regards to a recovery effect as a result of cleaning as well, since the surface 100a is flat, and due to the fact that the area where the foulant 102 is in contact with the surface 100a is large and the absorptive power is large, it is considered that it was difficult for the foulant 102 to become detached from the surface 100a, and recovery of the linear transmittance was small.

Figure 9B:
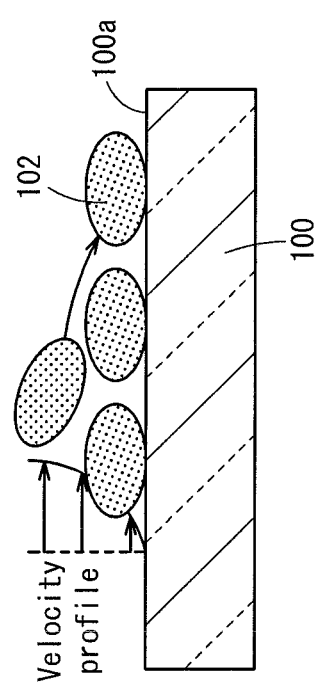
FIG. 9B is an explanatory view schematically showing actions of a transparent sealing member applied with respect to a foulant according to a Comparative Example 1.

In Comparative Example 1, the initial linear transmittance LTa was less than 20% and thus was low. This is considered to be due to the fact that, as shown in FIG. 9B, since the firing temperature is low, large recesses 104 having a size on the order of several μm, which is reflective of the particle size of $SiO_2$ particles, remain on the surface 100a, and consequently, light is scattered and a low linear transmittance is exhibited.

Further, in Comparative Example 1, although it is an improvement over Comparative Example 2, the maintenance rate Rrb after the immersion test was as low as 40%, and the maintenance rate Rrc after cleaning was as low as 40%. This is considered to be due to the fact that, as shown in FIG. 9B, although not so much as in Comparative Example 2, the foulant 102, such as a microorganism, a humic substance or the like, easily remains on the surface of the recesses 104 having a size on the order of several μm, and further, since adherence thereof is facilitated, the decrease in transmittance after the immersion test was large. Further, in regards to the recovery effect as a result of cleaning as well, due to the fact that the area where the foulant 102 is in contact with the surface of the recesses 104 is large and the absorptive power is large, it is considered that it was difficult for the foulant 102 to become detached, and recovery of the linear transmittance was small.

In contrast thereto, the initial linear transmittance LTa in Exemplary Embodiments 1 to 3 was 80% to 90%, which was not as high as that of Comparative Example 2, but nonetheless was high. This is considered to be due to the fact that, since the firing temperature is high, smoothing of large recesses having a size on the order of several μm progressed, and at the same time, a large number of the minute recesses 22 appeared over the entire surface, and the scattering effect became small. Consequently, a high transmittance is exhibited.

Further, the maintenance rate Rrb after the immersion test in Exemplary Embodiments 1 to 3 was as high as 72% to 73%, and the maintenance rate Rrc after cleaning was as high as 90% to 95%. This is considered to be due to at least the following two points (a) and (b), namely, that the foulant 102 does not easily remain on the surface 10a, and the decrease in transmittance after the immersion test is small. Further, in accordance with the same mechanism, it is considered that the recovery of the linear transmittance as a result of cleaning was also large.

Figure 9C:
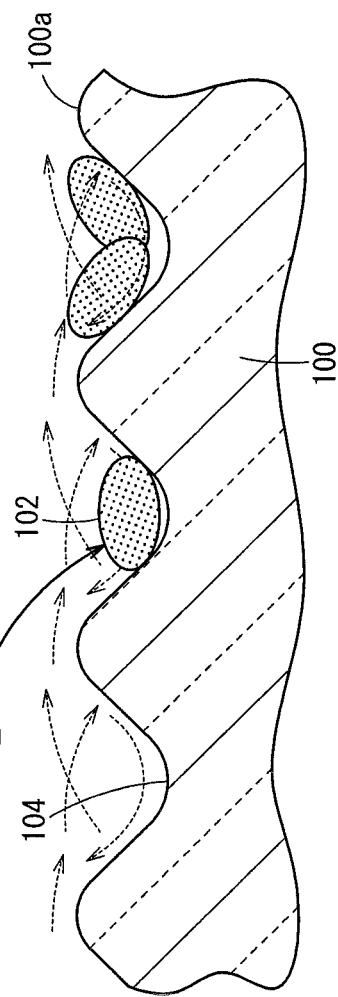
FIG. 9C is an explanatory view schematically showing actions of the transparent sealing member applied with respect to a foulant according to Exemplary Embodiments 1 to 3.

(a) As shown in FIG. 9C, the flow of the raw water is turbulent due to the large number of minute recesses 22 that are formed on the surface 10a in Examples 1 to 3.

(b) Because of the structure having the minute recesses 22, the contact area of the foulant 102 is reduced.

The transparent sealing member according to the present invention is not limited to the above-described embodiments, and it is a matter of course that various configurations can be adopted therein without departing from the spirit and gist of the present invention.

The invention claimed is:

1. A transparent sealing member adapted to be used with an optical component having at least one optical element, and a mounting substrate on which the optical element is mounted, and constituting, together with the mounting substrate, a package in which the optical element is accommodated;

wherein the transparent sealing member includes minute recesses on at least a surface from which light from the optical element is emitted;

an average width of the respective minute recesses is greater than or equal to 0.1 μm and less than or equal to 2.0 μm, and an average depth of the respective minute recesses is greater than or equal to 5 nm and less than or equal to 50 nm; and an average existence frequency of the minute recesses is greater than or equal to 100,000 and less than or equal to 3 million per 1 $mm^2$.

2. The transparent sealing member according to claim 1, wherein a material of the transparent sealing member is quartz glass.

3. The transparent sealing member according to claim 1, wherein a surface roughness Ra of at least a surface from which light from the optical element is emitted is 0.01 to 0.05 μm.

4. The transparent sealing member according to claim 2, wherein a surface roughness Ra of at least a surface from which light from the optical element is emitted is 0.01 to 0.05 μm.

* * * * *